United States Patent [19]
Casper

[11] Patent Number: 5,361,002
[45] Date of Patent: * Nov. 1, 1994

[54] VOLTAGE COMPENSATING CMOS INPUT BUFFER

[75] Inventor: Stephen L. Casper, Boise, Id.

[73] Assignee: Micron Technology, Inc., Boise, Id.

[*] Notice: The portion of the term of this patent subsequent to Jan. 11, 2011 has been disclaimed.

[21] Appl. No.: 135,214

[22] Filed: Oct. 12, 1993

Related U.S. Application Data

[63] Continuation of Ser. No. 864,701, Apr. 7, 1992, Pat. No. 5,278,460.

[51] Int. Cl.$^5$ .............................. H03K 3/01
[52] U.S. Cl. ................... 327/530; 327/543; 327/546; 327/108; 326/68
[58] Field of Search ............ 307/296.1, 296.4, 296.8, 307/270, 451, 542

[56] References Cited

U.S. PATENT DOCUMENTS 4,700,089 10/1987 Fujii et al. ..................... 307/451
5,220,534 6/1993 Redwine et al. ................ 365/226

Primary Examiner—Margaret Rose Wambach
Attorney, Agent, or Firm—David J. Paul

[57] ABSTRACT

The CMOS voltage compensating input buffer circuit of the present invention provides a means to stabilize input level trip points and is comprised of a voltage compensating circuit having an input node and an output drive node coupled to an input buffer. The voltage compensating circuit receives its input from a voltage adjusting circuit that follows changes in $V_{CC}$ while its output drive node is coupled to the series connected CMOS input buffer circuit having an input node and an output node. The buffer's input node receives a signal that VIH/VIL trip points will determine if the output is to be a high or a low and the buffer's output node then couples the resultant level to an output buffer circuit comprised of a CMOS inverter which provides the final output drive. The present invention provides trip point levels corresponding to industry standard VIH/VIL levels to accurately determine the corresponding output with operating voltage supplies (regulated or unregulated) operating between 2 V to 7.5 V.

22 Claims, 3 Drawing Sheets

VOLTAGE COMPENSATING CMOS INPUT BUFFER

CROSS-REFERENCE TO RELATED APPLICATION

This is a continuation to U.S. patent application No. 07/864,701 filed Apr. 7, 1992 now U.S. Pat. No. 5,278,460.

FIELD OF THE INVENTION

This invention relates to a CMOS voltage compensating input buffer circuit formed in a semiconductor integrated circuit (IC) and in particular is a circuit that may be used in various memory devices, such as dynamic random access memories (DRAMs) or erasable programmable read only memory families (EPROMs, EEPROMs, etc.).

BACKGROUND OF THE INVENTION

Standard IC operating input levels (VIH and VIL) have been set by industry standards whether the given IC is operating with a regulated power supply with very tight tolerances or with an unregulated supply. Operating input levels for a typical DRAM for example, are set at 0.8 V+/−100 mv for VIL and 2.4 V+/−100 mv for VIH. Typically, DRAMs are operating from unregulated supplies that may vary from 4.5 V to 5.5 V and the input level standards must still be adhered to. There is also may instances wherein qualification of DRAMs to meet industry reliability standards requires operating the DRAM at much higher voltages than the 5.5 V specification (i.e. 7.5 V for burn-in testing of a part's mortality rate) or lower than 4.5 V (i.e. 3 V supplied ICs). In order to meet this criteria, the DRAM's input buffers must correctly accept the various signals that are used to operate a DRAM (such as the signals used to read and write data), must be able to differentiate precisely between an intended low input(determined by VIL) to that of an intended high signal (determined by VIH).

SUMMARY OF THE INVENTION

The CMOS voltage compensating input buffer circuit of the present invention provides a means to stabilize input level trip points, and is comprised of a voltage adjusting circuit providing a voltage adjusting output node coupled to a voltage compensating circuit.

The voltage compensating circuit's drive node is coupled to a series connected CMOS input buffer circuit having an input node and an output node. The input node receives a signal that VIH/VIL trip points which determine if the output is to be a high or a low. The output node then couples the resultant level to an output buffer circuit comprised of a CMOS inverter which provides the final output node drive.

In order to maintain device reliability for future IC generations with sub-micron devices, the present invention provides trip point levels corresponding to industry standard VIH/VIL levels to accurately determine the corresponding output with operating voltage supplies operating between 2 V to 7.5 V. In fact, the present invention will work with any operating voltage supplies that will be used to power future ICs. The present invention also allows the use of both regulated or unregulated power supplies as trip point levels for VIH/VIL are accurately maintained with fluctuating voltages.

DETAILED DESCRIPTION OF THE PREFERRED EMBODIMENT

Figure 2:
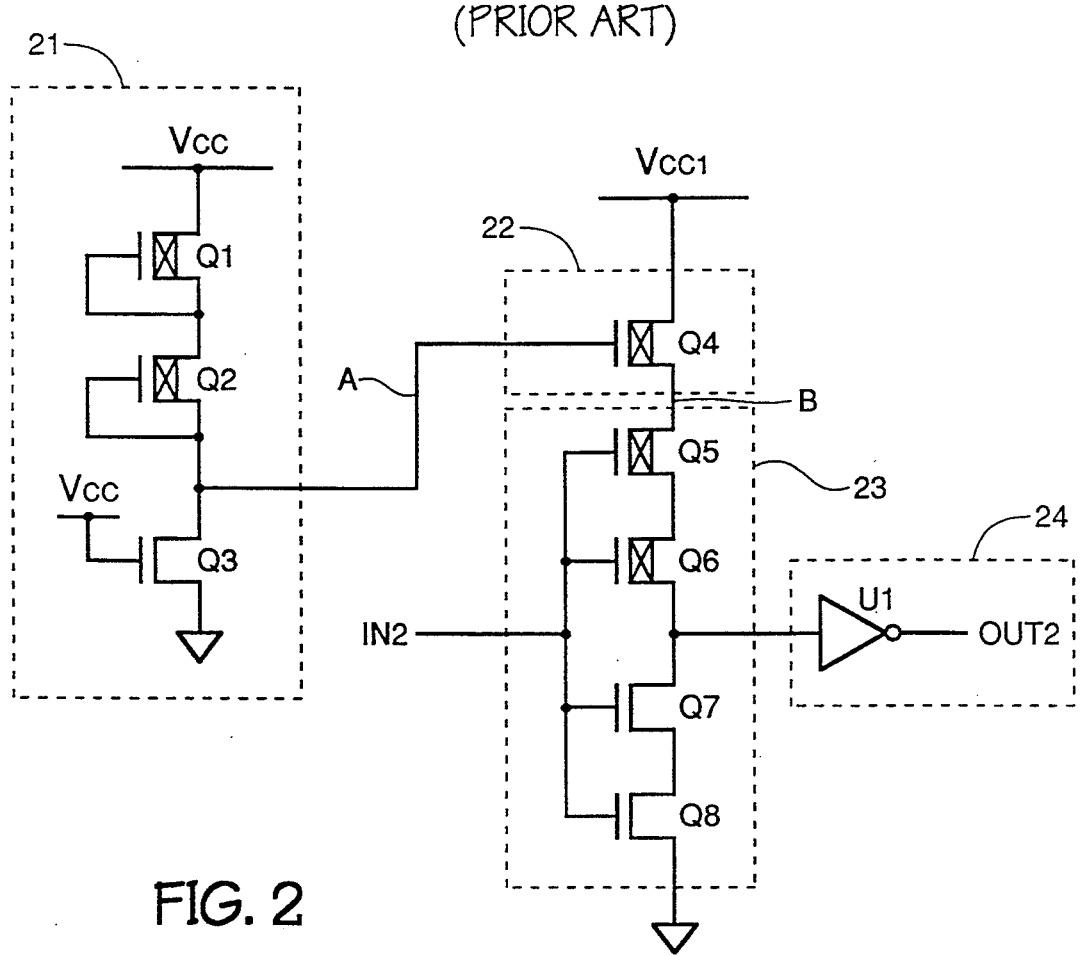
FIG. 2 is a schematic of the preferred embodiment depicting a voltage compensating CMOS input buffer.

FIG. 2 depicts a schematical representation of the preferred embodiment for the input buffer voltage compensating circuit with the present invention comprising, voltage adjusting circuit stage 21, voltage compensating stage 22, input stage 23 and output stage 24. The voltage adjusting circuit stage 21 and output stage 24 are stages used to interface between the present invention and outer lying circuitry. Though these circuits are used to discuss the present invention they can be any circuit of designer's choice that provides these functions. For example, output stage 24 need not be present as the output could simply be taken from the output of input stage 23 without departing from the scope of the present invention.

Voltage adjusting circuit 21 comprises PMOS transistors Q1 and Q2 connected in series fashion with the source of Q1 coupled to $V_{CC}$ and its gate and drain terminals coupled together as well as coupled to the source of Q2. Q2 also has its gate and drain terminals coupled together as well as coupled to the drain of NMOS transistor Q3 (referred to as node A). Q3 has its gate terminal coupled to $V_{CC}$ and its source terminal coupled to $V_{SS}$ (or ground). Voltage adjusting circuit 21 is the preferred voltage adjusting circuitry of the present invention, however any circuit that adjusts the voltage at node A can be used for stage 21 without departing form the operational scope of the present invention.

Voltage compensating circuit 22 comprises PMOS transistor Q4 with its source terminal coupled to $V_{CC1}$ and its gate terminal coupled to node A of voltage adjusting stage 21. The significance of Q4, will be brought to light later in this document when comparisons of circuit operation simulations between a conventional input buffer depicted in FIG. 1 and the present invention depicted in FIG. 2 are made.

Input stage 23 is comprised of a CMOS inverter, formed from PMOS transistors Q5 and Q6 and NMOS transistors Q7 and Q8. The source of Q5 is couple to the drain of voltage compensating transistor Q4, while its drain terminal is coupled to the source terminal of Q6. The drain of Q6 is in turn coupled to the drain of NMOS transistor Q7, thereby providing an output node. The source of Q7 is coupled to the drain of Q8 while the source of Q8 is coupled to $V_{SS}$. The gates of all input stage transistors Q5, Q6, Q7 and Q8 are coupled together to form the input node.

Output stage 24 is comprised of CMOS inverter U1 with the input terminal of U1 coupled to drain connections of input stage transistors Q6 and Q7, while its output terminal becomes the output node (Out2).

For a general understanding of circuit operation assume for sake of illustration that the threshold voltage (vt.) for all n-channel devices is approximately equal to 0.8 V and −0.8 V for all p-channel devices (typical threshold voltages range from 0.6 V to 1.2 V). Further assume that series transistors in their respective stages are matched. It is also important to note that $V_{CC1}$ and $V_{SS}$ need not be the IC's operating supplies, (i.e. normally referred to as power and ground), but instead they may represent voltage potentials in a circuit which provides a difference in potential (preferably a potential between 2 V to 7.5 V). For example, $V_{CC1}$ may equal 15 V and $V_{SS}$ may equal 7.5 V or simply $V_{CC1}$ may result by having an enabling transistor connected between the source of Q4 and $V_{CC}$ while $V_{SS}$ is at ground.

GENERAL OPERATION

Referring to back to FIG. 2, voltage adjusting circuit 21 may be any circuitry that will adjust node A according to the operating level of $V_{CC}$ (preferably $V_{CC}$ is between the range of 2 to 7.5 V, but due to the addition of voltage compensating transistor Q4, it is conceivable that the present invention would provide stable trip point levels for VIH at $V_{CC}$ levels above 7.5 V and maintain trip point levels for VIL at $V_{CC}$ below 2 V). As $V_{CC}$ rises, voltage adjusting circuit increases the voltage potential at node A thereby reducing the drive of Q4 (of circuit 22) which will reduce the voltage potential at node B. This lowered potential at node B allows the inverter configuration of input stage 23 to operate safely in the set VIH/ VIL levels of 2.4 and 0.8 V. As operating comparisons between FIGS. 1 and 2 will show, Q4 maintains VIH trip point levels as $V_{CC}$ increases, as VIH trip points tend to rise as the threshold voltage of operating transistors increase with $V_{CC}$. In other words, worse case for VIH is at higher $V_{CC}$ operating levels. Q4 on the other hand, maintains VIH/VIL trip point levels for low $V_{CC}$ (i.e. 4 V and below). Also, depending on designer's choice, Q4 could be an NMOS transistor and instead connect between the source of Q8 and $V_{SS}$ which would in effect raise Q8's source above $V_{SS}$, thereby maintaining VIH/VIL trip point levels for increases in $V_{CC}$.

As $V_{CC}$ decreases, voltage adjusting circuit decreases the voltage potential at node A, thereby increasing the drive of Q4 (of circuit 22) which will increase the voltage potential at node B closer to $V_{CC}$. This higher potential at node B allows the inverter configuration of input stage 23 to operate safely in the set VIH/VIL levels of 2.4 and 0.8 V.

The circuit operation of the present invention in light of changing $V_{CC}$ operating levels, will become evident in the representative cases of an input signal transitioning between VIH (2.4 V) and VIL (0.8 V) as compared hereinafter, between the operation of a conventional input buffer and the present invention.

VIH TO VIL TRANSITIONS ($V_{CC}=V_{CC1}=6$ V)

Figure 1:
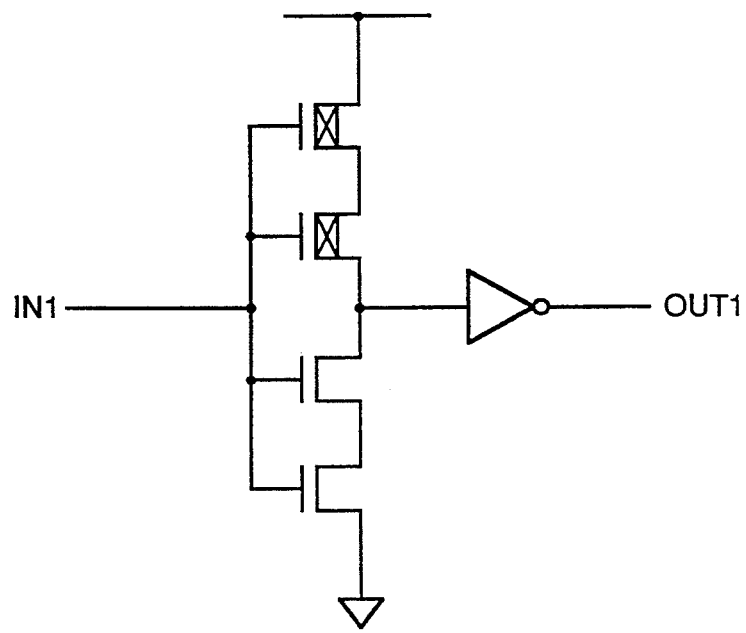
FIG. 1 is a schematic of a CMOS voltage input buffer, which may be viewed as related art.
Figure 3:
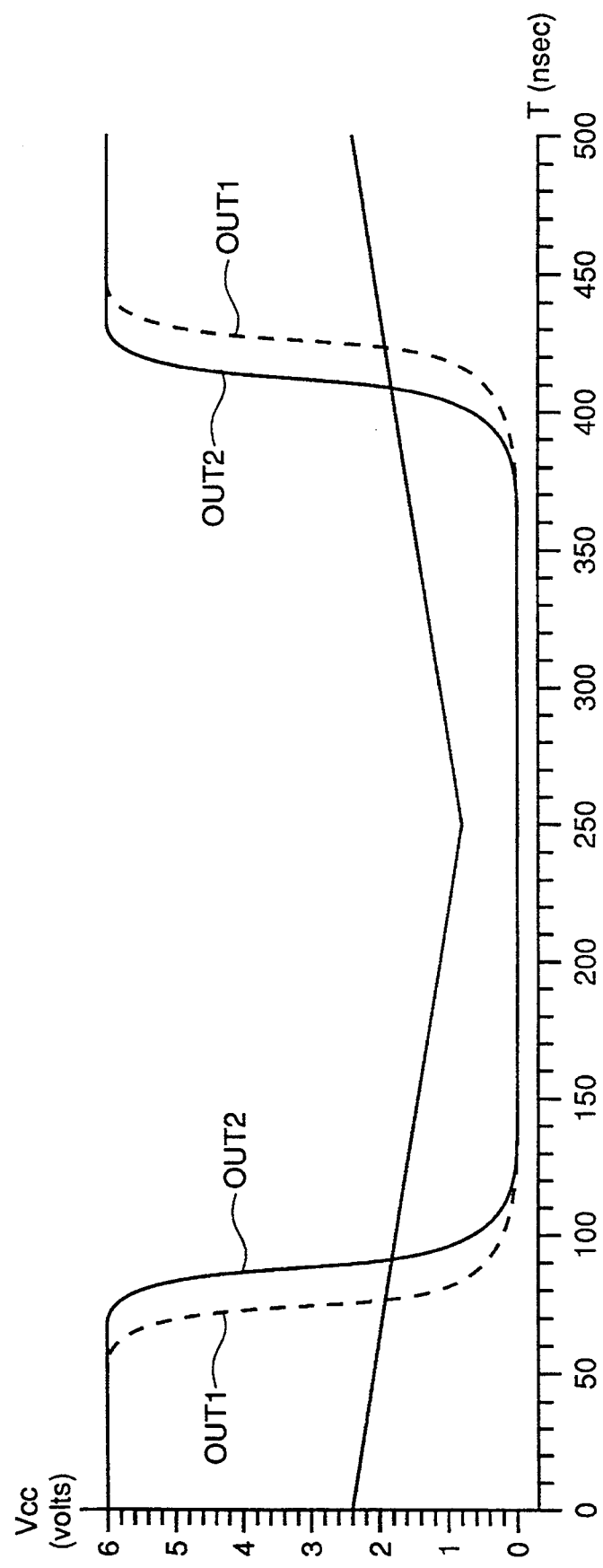
FIG. 3 is a computer simulation comparing the circuit response of FIG. 1 to the present invention (shown in FIG. 2) during circuit operation at VCC=6 V.

In this discussion, refer to the circuit simulations, as graphed in FIG. 3, which compare the operations of the circuits of FIGS. 1 and 2. As FIG. 3 shows, both input buffers of FIGS. 1 and 2 are operating from a power supply potential of 6 V. Both output nodes, Out1 (of FIG. 1) and Out2 (of FIG. 2), are at an output potential level of 6 V with the inputs set at a beginning VIH potential level of 2.4 V at T=0 ns. Looking only at ideal transition curves, Out1 transitions from 6 V down to 0 V between 68 and 78 ns when the input level approaches approximately 2.0 V. Out2, on the other hand, transitions from 6 V down to 0 V between 85 and 95 ns when the input level approaches approximately 1.8 V. The present invention adds an additional VIH/VIL guardband of 0.2 V while guaranteeing a high level (6 V in this case) at Out2.

VIL TO VIH TRANSITIONS ($V_{CC}=V_{CC1}=6$ V)

Continuing with the simulations of FIG. 3, the input level approaches a VIL level of 0.8 V and then transitions toward the VIH level of 2.4 V. Out2 (now at 0 V) transitions to 6 V between 415 and 425 ns once the input level approaches 1.8 V. Out1 (also at 0 V), on the other hand, does not transition to 6 V until between 430 and 440 ns when the input level approaches 2.0 V. As before, a 0.2 V guardband to VIH/VIL is demonstrated.

VIH TO VIL TRANSITIONS ($V_{CC}=V_{CC1}=4$ V)

Figure 4:
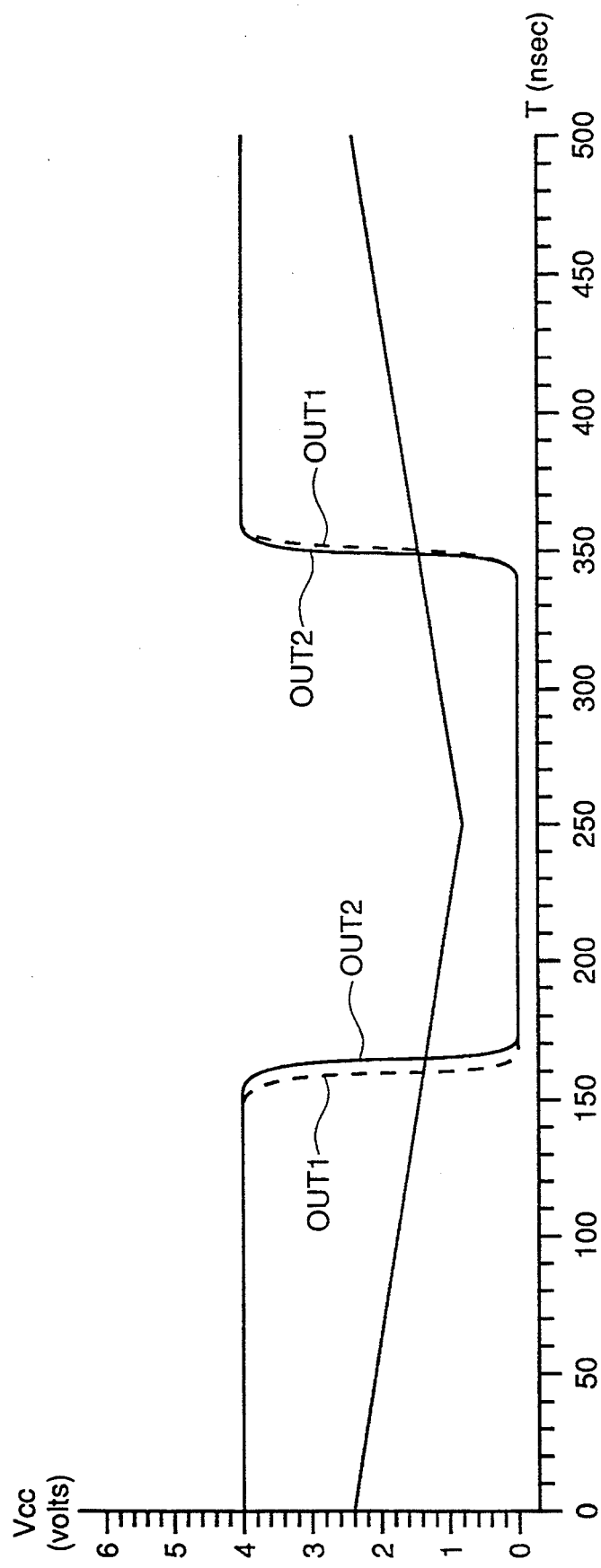
FIG. 4 is a computer simulation comparing the circuit response of FIG. 1 to the present invention (shown in FIG. 2 during circuit operation at VCC=4 V.

In this discussion, refer to the circuit simulations, as graphed in FIG. 4, which compare the operations of the circuits of FIGS. 1 and 2. As FIG. 4 shows, both input buffers of FIGS. 1 and 2 are operating from a power supply potential of 4 V. Both output nodes, Out1 (of FIG. 1) and Out2 (of FIG. 2), are at an output potential level of 4 V with the inputs set at a beginning VIH potential level of 2.4 V at T=0 ns. Looking only at ideal transition curves, Out1 transitions from 4 V down to 0 V between 158 and 163 ns when the input level approaches approximately 1.35 V. Out2, on the other hand, transitions from 4 V down to 0 V between 155 and 160 ns when the input level approaches approximately 1.4 V. This simulation shows that the present invention maintains VIH/VIL trip point levels thereby guaranteeing a low level (0 V in this case) at Out2.

VIL TO VIH TRANSITIONS ($V_{CC}=V_{CC1}=4$ V)

Continuing with the simulations of FIG. 4, the input level approaches a VIL level of 0.8 V and then transitions toward the VIH level of 2.4 V. Out2 (now at 0 V) transitions to 4 V between 351 and 357 ns once the input level approaches 1.45 V. Out1 (also at 0 V), on the other hand, transitions to 4 V between 349 and 355 ns when the input level approaches 1.42 V. As before, the present invention maintains VIH/VIL trip point levels thereby guaranteeing a high level (4 V in this case) at Out2.

Sizing selected for PMOS and NMOS transistors should be such that sufficient drive is provided to OUT2 for a specific load, whether the output is a high or a low.

It is to be understood that although the present invention has been described with reference to a preferred embodiment, various modifications (such as NMOS and PMOS transistor ratios and sizing, varying circuit operating potentials or even developing a bipolar transistor version) known to those skilled in the art, may be made to the circuit presented herein without departing from the invention as recited in the several claims appended hereto.

I claim:

1. A memory device comprising a voltage compensating CMOS input buffer circuit, said voltage compensating CMOS input buffer circuit comprising:
   first, second and third voltage potentials;
   a voltage adjusting circuit providing a voltage adjusting output node, said voltage adjusting circuit comprising a plurality of voltage adjusting transistors connected serially and coupled between said first and third voltage potentials, said plurality of voltage adjusting transistors providing said voltage adjusting output node by a common connection between two transistors;

a voltage compensating circuit providing a voltage compensating drive node, said voltage compensating circuit coupled to said voltage adjusting output node and said second voltage potential; and an input buffer circuit providing an output node, said input buffer circuit comprising a plurality of input transistors connected serially between said second and third potential sources, each transistor having an input terminal for receiving input signals, said plurality of input transistors providing said output node by a common connection between at least two of the input transistors.

2. The circuit as recited in claim 1, wherein said voltage adjusting circuit further comprises:

first, second and third transistors, each transistor having an input terminal and first and second output terminals, said first transistor having its first output terminal coupled to said first potential source, its input and second output terminals coupled to said second transistor's first output terminal, said second transistor having its input terminal and second output terminal coupled to said third transistor's first output terminal thereby forming said voltage adjusting output node, said third transistor's input terminal coupled to said first voltage potential and its second output terminal coupled to said third voltage potential.

3. The circuit as recited in claim 1, wherein said voltage compensating circuit comprises:

a transistor having an input terminal and first and second output terminals, said transistor's input terminal coupled to said voltage adjusting output node, its first output terminal coupled to said second voltage potential and its second output terminal coupled to said voltage compensating drive node.

4. The circuit as recited in claim 1, wherein said input buffer circuit further comprises:

first, second and third transistors each transistor having an input terminal and first and second output terminals, said input terminals of all four transistors are coupled together thereby forming an input node, said first transistor's first output terminal coupled to said voltage compensating drive node and its second output terminal coupled to said second transistor's first output terminal, said second transistor's second output terminal coupled to said third transistor's first output terminal thereby forming said output node, said third transistor's second output terminal coupled to said fourth transistor's first output terminal and said fourth transistor's second output terminal coupled to said third voltage potential.

5. The circuit as recited in claim 1, further comprising and output buffer, wherein said output buffer circuit comprises a logic inverter having an input terminal coupled to said input buffer output node and an output terminal forming said output buffer output node.

6. The voltage adjusting circuit as recited in claim 2, wherein said first and second transistors are PMOS transistors and said third transistor is an NMOS transistor.

7. The voltage compensating circuit as recited in claim 3, wherein said transistor is a PMOS transistor.

8. The input buffer circuit as recited in claim 4, wherein said first and second transistors are PMOS transistors and said third and fourth transistors are NMOS transistors.

9. The circuit as recited in claim 1, wherein said first voltage potential is equal to said second voltage potential.

10. The circuit as recited in claim 1, wherein said first voltage potential is greater than said second voltage potential.

11. The circuit as recited in claim 1, wherein said first voltage potential and said second voltage potential provide a voltage potential between 2 V to 7.5 V.

12. The circuit as recited in claim 1, wherein said first voltage potential and said second voltage potential provide a voltage potential below 2 V.

13. The circuit as recited in claim 1, wherein said first voltage potential and said second voltage potential provide a voltage potential above 7.5 V.

14. A dynamic random access memory device comprising a voltage compensating CMOS input buffer circuit, said voltage compensating CMOS input buffer circuit comprising:

first, second and third voltage potentials;

a voltage adjusting circuit providing a voltage adjusting output node, said voltage adjusting circuit comprising a plurality of voltage adjusting PMOS and NMOS transistors connected serially and coupled between said first and third voltage potentials, said plurality of serially connected PMOS and NMOS transistors providing said voltage adjusting output node by a common connection between series PMOS and NMOS transistors;

a voltage compensating circuit providing a voltage compensating drive node, said voltage compensating circuit coupled to said voltage adjusting output node and said second voltage potential; and an input buffer circuit providing an output node, said input buffer circuit comprising a plurality of input PMOS and NMOS transistors connected serially between said second and third voltage potentials, each transistor having an input terminal for receiving input signals, said plurality of input transistors providing said output node that is common between series PMOS and NMOS input transistors.

15. The circuit as recited in claim 14, wherein said voltage adjusting circuit further comprises:

first and second PMOS transistors and an NMOS transistor, each transistor having an gate terminal, a source terminal and a drain terminal, said first PMOS transistor having its source terminal coupled to said first potential source and its gate and drain terminals coupled to said second PMOS transistor's source terminal, said second PMOS transistor having its gate and drain terminals coupled to said NMOS transistor's drain terminal thereby forming said voltage adjusting output node, said NMOS transistor's gate terminal coupled to said first voltage potential and its source terminal coupled to said third voltage potential.

16. The circuit as recited in claim 14, wherein voltage compensating circuit comprises:

a PMOS transistor having a gate terminal, a source terminal and a drain terminal, said PMOS transistor's gate terminal coupled to said voltage adjusting output node, its source terminal coupled to said second voltage potential and its drain terminal coupled to said voltage compensating drive node.

17. The circuit as recited in claim 14, wherein said input buffer circuit further comprises:

first and second PMOS transistors and first and second NMOS transistor, each transistor having a gate terminal, a source terminal and a drain terminal, said gate terminals of all four transistors are coupled together thereby forming an input node, said first PMOS transistor's source terminal coupled to said voltage compensating drive node and its drain terminal coupled to said second PMOS transistor's source terminal, said second PMOS transistor's drain terminal coupled to said first NMOS transistor's drain terminal thereby forming said output node, said first transistor's source terminal coupled to said second NMOS transistor's drain terminal and said second NMOS transistor's source terminal coupled to said third voltage potential.

18. The circuit as recited in claim 14, wherein said first voltage potential is equal to said second voltage potential.

19. The circuit as recited in claim 14, wherein said first voltage potential is greater than said second voltage potential.

20. The circuit as recited in claim 14, wherein said first potential source and said second potential source provide a voltage potential between 2 V to 7.5 V.

21. The circuit as recited in claim 14, wherein said first voltage potential and said second voltage potential provide a voltage potential below 2 V.

22. The circuit as recited in claim 14, wherein said first voltage potential and said second voltage potential provide a voltage potential above 7.5 V.

* * * * *